United States Patent
Symes et al.

(10) Patent No.: US 6,831,952 B2
(45) Date of Patent: Dec. 14, 2004

(54) SYSTEM, METHOD AND COMPUTER PROGRAM FOR DECODING AN ENCODED DATA STREAM

(75) Inventors: Dominic Hugo Symes, Cherry Hinton (GB); Hedley James Francis, Newmarket (GB)

(73) Assignee: Arm Limited, Cambridge (GB)

( * ) Notice: Subject to any disclaimer, the term of this patent is extended or adjusted under 35 U.S.C. 154(b) by 731 days.

(21) Appl. No.: 09/799,878

(22) Filed: Mar. 7, 2001

(65) Prior Publication Data

US 2001/0033626 A1 Oct. 25, 2001

(30) Foreign Application Priority Data

Mar. 8, 2000 (GB) .............................. 0005584
Apr. 20, 2000 (GB) .............................. 0009955

(51) Int. Cl.[7] .......................... H04L 27/00; H03D 1/00; H03M 13/03
(52) U.S. Cl. ..................... 375/259; 375/341; 714/795
(58) Field of Search ................ 375/259, 262, 375/341, 359; 714/795

(56) References Cited

U.S. PATENT DOCUMENTS

| | | | | |
|---|---|---|---|---|
| 4,646,305 A | * | 2/1987 | Tretter et al. ............... | 714/789 |
| 4,979,175 A | * | 12/1990 | Porter ......................... | 714/795 |
| 5,355,376 A | * | 10/1994 | Cox et al. .................... | 714/795 |
| 5,602,858 A | * | 2/1997 | Kitaori ........................ | 714/795 |
| 6,256,339 B1 | * | 7/2001 | Kaewell, Jr. ................. | 375/147 |
| 6,601,215 B1 | * | 7/2003 | Thurnhofer .................. | 714/795 |

OTHER PUBLICATIONS

J. Sparso et al, "Design of a Fully Parallel Viterbi Decoder" IFIP Transactions A, Computer Science and Technology, Elsevier, vol. A–1, 1992, pp. 29–38.

* cited by examiner

Primary Examiner—Stephen Chin
Assistant Examiner—Cicely Ware
(74) Attorney, Agent, or Firm—Nixon & Vanderhye P.C.

(57) ABSTRACT

A technique for decoding an encoded data stream representing an original sequence of data bits, each data bit comprising a plurality of codes, each code being dependent on a current data bit and a first predetermined number of preceding data bits in the original sequence. Scores are provided indicating the likelihood that a corresponding state represents the first predetermined number of preceding data bits. The scores are arranged in an initial ordering. A first plurality of score bit slices are stored to collectively represent the initially ordered scores, each score bit slice containing a predetermined bit from each of the scores. The scores are then reordered and a second plurality of score bit slices are stored to collectively represent the reordered scores. By this approach, all the scores are updated simultaneously.

13 Claims, 6 Drawing Sheets

SYSTEM, METHOD AND COMPUTER PROGRAM FOR DECODING AN ENCODED DATA STREAM

BACKGROUND OF THE INVENTION

1. Field of the Invention

The present invention relates to a system and method for decoding an encoded data stream.

2. Description of the Prior Art

Bit errors can often arise when transmitting data across a medium, such as radio, infra-red, via a hard disk's magnetic head, etc. Accordingly, it is known to encode data prior to transmission so as to add redundancy to the original data before it is transmitted. A suitable decoder is then used when the data stream is received to decode the encoded data stream, with the redundancy providing some resilience to bit errors. Of course, the more redundancy added during encoding, the more bits that need to be transmitted, and accordingly, a balance is necessary between the amount of redundancy added, and the amount of resilience to bit errors achieved as a result of the addition of the redundancy.

One common encoding technique is often referred to as convolutional encoding, which produces an encoded data stream comprising a plurality of codes. Whenever the encoder receives an input to be encoded, e.g. a data bit, it generates a code dependent on the received input, and a number of previous inputs received by the encoder. A term called "constraint length" is used to indicate the number of inputs that a convolutional encoder uses in order to generate an output code. For example, if the constraint length "k" is 7, this means that the output code generated by the convolutional encoder is dependent on the current input, plus the previous 6 inputs. Accordingly, it will be appreciated that for each input, there are $2^{k-1}$ previous states that the encoder could be in.

There are many different uses for the above type of encoding, for example in hard disk drives, mobile phones, and Digital Audio Broadcast (DAB) radio. One example of a standard relating to DAB is the ETSI (European Telecommunications Standard Institute) ETS 300 401 May 1997 (Second Edition) standard entitled "Radio Broadcasting Systems;Digital Audio Broadcasting (DAB) to mobile, portable and fixed receivers". In DAB radio, the constraint length k of the encoder is 7, so, for each input bit, there are 64 states that the encoder could be in (based on the 6 previous input bits).

When an original sequence of data bits has been encoded to form an encoded data stream, it will be appreciated that a technique needs to be provided at the receiving end for decoding the data stream and using the redundancy therein to seek to correct any errors in the information received. One algorithm often used to perform such decoding is the Viterbi algorithm which is typically used to decode convolutionally encoded data streams. A general description of the Viterbi algorithm is given in the publication "Digital Communications" by John G. Proakis (Third Edition). McGraw-Hill Inc.

In accordance with the Viterbi technique, a table such as that illustrated in FIG. 1 is generated, which has an entry for each of the $2^{k-1}$ states, and which is updated upon receipt of each code in the encoded data stream, Hence, as illustrated in FIG. 1, each entry will have a field 20 identifying the state, a field 30 identifying a "metric" or score associated with that state, and a path history 40 giving an indication of a predetermined number of bits that are considered to be bits in the original data sequence assuming the associated state is the most likely state.

When each code is received, the metric 30 for each of the states must be updated, and the state with the "best" metric (e.g. typically the one with either the lowest or the highest value depending on the implementation) is selected as having the correct path. Accordingly, the oldest bit in that state's path history 40 is then output as the correct output bit for this stage.

To indicate how the metrics are typically updated for each state, reference will be made to FIG. 2, which indicates how a new state is related to a previous state. It will be appreciated that, assuming a particular state is correct, then when a new bit is received by the encoder, that bit will either be a logic zero value or a logic one value, and accordingly there are two possibilities as to the data used to generate the code output by the encoder. Due to the possibility of corruption of the signal, it will be appreciated that, when a code is received at the decoder, it is necessary to determine, for each state in the table 10, the likelihood that that state represents the k-1 previous input bits used along with a new input bit to generate the code.

With reference to FIG. 2, this illustrates the possible states assuming the constraint length k is 4, and that accordingly three preceding input bits are used along with a new input bit to generate a code. On the left hand side of the diagram, it will be seen that all of the eight possible states of the three preceding bits are indicated. Considering the example of the old state being 001, it will be appreciated that the data upon which the code generated by the encoder was based would either be 0010 or 0011, i.e. the new bit can only be 0 or 1. The decoder knows what the code generated by the encoder would have been had the bits in fact been 0010 or 0011. and can accordingly compare those codes with the code received to determine the likelihood that the bits used to generate the transmitted code were in fact 0010 or 0011. This comparison yields an update value (often referred to as a Hamming distance) which can be used to generate an updated score for the state.

As is also apparent from FIG. 2, although once the code has been processed, there are still the same set of states in the table 10, the way in which these states are related to the old states is quite complex. For example, the new state 010 may have arisen from the previous states 001 or 101, in both cases with the new bit received being a 0. Hence, Hamming distances can be generated for each possibility based on comparing the code received with the code expected for 0010 and 1010, respectively. Then the metric associated with the old state 001 is retrieved, and the corresponding Hamming distance is added to that metric, resulting in a possible updated metric. This process is repeated for the metric associated with the state 101, whereby two possible metrics for the new state 010 have now been calculated. Whichever of the two possible metrics is deemed best (for example, the one with the smallest value if the Hamming distance is defined to increase as the match between the two codes gets worse) is selected, and used as the new metric for state 010. In addition, the relevant bit is added to the relevant path history. For example, if state 010 is deemed to have arisen from state 001, it can be seen that logic 0 value should be added to the path history for 001. This path history is then copied to the state 010 as the new path history for that state. Alternatively, if state 010 is deemed to have arisen from state 101, it can be seen that a logic 1 value should be added to the path history for state 101, and this path history then copied to the state 010 as the new path history for that state.

The above process is performed for each of the states in the table 10, with the end result being that each of the metrics 30 and path histories are updated. Further, if the path history is already full, then the oldest bit in the path history associated with the state having the best metric may be output at this time as the bit considered to be the correct bit in the original data sequence.

Given the above description, it will be appreciated that for each state update, two metrics (often metrics from different states to the state being updated) need to be added to two Hamming distances (which are dependent on the code received) and the smaller of the two (assuming a smaller distance is better) is selected and then stored in association with the state being updated. Later, when output bits are required from the decoder, all of the metrics are compared, and the state with the best metric is deemed to have associated therewith the path which is closest to the original data.

From the above description, it will be appreciated that a significant amount of processing needs to be performed to determine each state update, since as mentioned above each state update requires two metrics to be added to two Hamming distances, for the two results to be compared, and one of them selected. This process then needs to be repeated for each state in the table 10.

Accordingly, it is an object of the present invention to provide an improved technique for updating the metrics for each state.

SUMMARY OF THE INVENTION

Viewed from a first aspect, the present invention provides a method of decoding an encoded data stream representing an original sequence of data bits, wherein the encoded data stream comprises a plurality of codes, each code being dependent on a current data bit and a first predetermined number of preceding data bits in the original sequence, the method comprising the steps of. (a) for each of a number of possible states of the first predetermined number of preceding data bits, providing a score indicating the likelihood that the corresponding state represents the first predetermined number of preceding data bits; (b) arranging the scores in an initial ordering; (c) receiving a code; (d) given each of the two possible values of the current data bit in the received code, determining for each state two update values indicating the likelihood, based on the received code, that that state represents the first predetermined number of bits; (e) storing a first plurality of score bit slices to collectively represent the scores as arranged at said step (b), each score bit slice containing a predetermined bit from each of the scores; (f) reordering the scores and storing a second plurality of score bit slices to collectively represent the reordered scores, each score bit slice containing a predetermined bit from each of the reordered scores; (g) generating from the update values a first plurality of update bit slices for the first plurality of score bit slices and a second plurality of update bit slices for the second plurality of score bit slices, each update bit slice representing a predetermined bit from predetermined ones of said update values; (h) generating a first candidate plurality of updated score bit slices from the first plurality of score bit slices and the first plurality of update bit slices, and generating a second candidate plurality of updated score bit slices from the second plurality of score bit slices and the second plurality of update bit slices; (i) generating a plurality of updated score bit slices by, for each score represented by the bit slices, applying predetermined criteria to select the bits for that score from either the first candidate or the second candidate plurality of updated score bit slices; whereby all the scores are updated simultaneously.

Rather than updating the score for each state one at a time, the present invention enables the scores for all states to be updated simultaneously. In the conventional prior art approaches, each score is stored in a separate word, but in accordance with the present invention the simultaneous update of the scores is achieved by "bit slicing" the relevant values required in the calculations. Hence, in accordance with preferred embodiments of the present invention, the lowest significant bit of the scores for every state are held together in a single word (which, depending on the number of states, may consist of multiple machine words, e.g. multiple 32-bit machine words), the next most significant bit of the scores for all the states are held in another word, and so on. Therefore, considering an example where each score is required to have eight bits of precision, then there will typically be provided eight bit slices to hold all of the scores. This bit slicing technique is illustrated by way of example with reference to the following two tables, where Table 1 illustrates the conventional technique where the scores a, b, c, d, . . . z are stored in separate words, and Table 2 shows the bit slicing technique of preferred embodiments, where each word ("bit slice") contains a predetermined bit from each of the scores:

TABLE 1

|  |  | bit N | .. | bit7 | bit6 | bit5 | bit4 | bit3 | bit2 | bit1 | bit0 |
|---|---|---|---|---|---|---|---|---|---|---|---|
| word 0 | = | -- | -- | a7 | a6 | a5 | a4 | a3 | a2 | a1 | a0 |
| word 1 | = | -- | -- | b7 | b6 | b5 | b4 | b3 | b2 | b1 | b0 |
| word 2 | = | -- | -- | c7 | c6 | c5 | c4 | c3 | c2 | c1 | c0 |
| word .. |  | -- | -- | .. | .. | .. | .. | .. | .. | .. | .. |
| word $2^{k-1}$ | = | -- | -- | z7 | z6 | z5 | z4 | z3 | z2 | z1 | z0 |

TABLE 2

|  |  | bit $2^{k-1}$ |  |  |  | bit2 | bit1 | bit0 |
|---|---|---|---|---|---|---|---|---|
| word 0 | = | z0 | .. | .. | .. | C0 | b0 | a0 |
| word 1 | = | z1 | .. | .. | .. | C1 | b1 | a1 |
| word 2 | = | z2 | .. | .. | .. | C2 | b2 | a2 |
| word .. |  | .. | .. | .. | .. | .. | .. | .. |
| word 7 | = | z7 | .. | .. | .. | C7 | b7 | a7 |

In accordance with the present invention, a first plurality of score bit slices are stored based on an initial ordering of the scores. However, as mentioned earlier with reference to FIG. 2, there are two possible routes for updating any particular state. In accordance with the present invention, this issue is addressed by re-ordering the scores and storing a second plurality of score bit slices to collectively represent the re-ordered scores, such that two separate plurality of score bit slices are then stored.

Further, in accordance with the present invention, the update values (for example Hamming distances) are also stored as bit slices, with a first plurality of update bit slices being generated for the first plurality of score bit slices and a second plurality of update bit slices being generated for the second plurality of score bit slices.

Then, a first candidate plurality of updated score bit slices is generated from the first plurality of score bit slices and the first plurality of update bit slices, and similarly a second candidate of updated score bit slices is generated from the second plurality of score bit slices and the second plurality of update bit slices. In preferred embodiments, these candidate plurality of updated score bit slices are generated by adding the corresponding plurality of score bit slices and corresponding plurality of update bit slices together.

In accordance with the present invention, a final step is then employed which applies predetermined criteria to determine for each individual score whether that score should be selected from the first candidate plurality of updated score bit slices or the second candidate plurality of updated score bit slices. This results in the generation of a final plurality of updated score bit slices which reflects all of the updated scores, whereby it can be seen that all of the scores are updated simultaneously.

In preferred embodiments, the method of the present invention is implemented in software, and due to the simultaneous updating of all of the scores has been found to offer significant potential speed improvements over the known prior art techniques.

In preferred embodiments, upon receipt of a further code from the encoded data stream, the plurality of updated score bit slices are treated as the first plurality of score bit slices and steps (f) to (i) are repeated, with the update values used in step (g) being based on the further code.

In the known prior art systems, as described earlier with reference to FIG. 2, the metrics are not written back to the same state which they are read from, and indeed some metrics can be duplicated. For this reason, the traditional prior art techniques use two banks of metrics and path histories. One set is used to write into and the other set is used to read from. Once all of the states have been updated, then they are swapped. In these prior art techniques, the positions of the states stay the same, and the metrics are moved. For a particular state n and a N state Viterbi:

metric[n*2] comes from either metric[n] or metric [n+N/2].

metric[n*2+1] comes from either metric[n] or metric [n+N/2].

This can for example be seen to be the case from the example of FIG. 2, where N is 8 and n varies from 0 to 7.

Hence, it would appear that the storing of the scores as a plurality of bit slices would lead to a number of complications, since at the end of each update, all of the bits in each bit slice would need to be moved around. However, in accordance with the preferred embodiments of the present invention, on each iteration, the plurality of updated score bit slices are treated as the first plurality of score bit slices without any rearrangement of the bits in each bit slice, and the scores are only re-ordered to form the second plurality of score bit slices. In such preferred embodiments, it has been found that, assuming each code is dependent on k bits, then although during each iteration of steps (f) to (i) the states represented by individual scores contained within the plurality of updated score bit slices change, the scores return to the initial ordering following k-1 iterations of the steps (f) to (i). Hence, by this approach, rather than keeping the states in the same place as is the case with known prior art techniques, at least one of the sets of metrics stays in the same place, and the nominal states which that metric represents change during each iteration. However, within a relatively short number of iterations, the scores return to the initial ordering.

In preferred embodiments, a record is maintained of the states represented by the individual scores for each of the k-1 iterations. Hence, with a knowledge of which iteration is being performed, it is possible to determine which state any particular score is associated with.

In preferred embodiments, the re-ordering of the scores at the step (f) is dependent on the particular iteration. However, since in preferred embodiments, no re-ordering of the first plurality of score bit slices takes place, it has been found that the re-ordering of the scores in order to form the second plurality of score bit slices involves merely a linear re-ordering of metrics, rather than the complex fanning out movement illustrated earlier with reference to FIG. 2. Hence, it has been found that in the preferred embodiments of the present invention, the number of operations required to perform the re-ordering is significantly less than that required having regard to the complex re-ordering that would be indicated by the known prior art techniques.

In preferred embodiments, step (d) is executed prior to decoding the encoded data stream in order to generate a lookup table of update bit slices for each of the k-1 iterations, whereby at said step (g) the update bit slices are read from the lookup table based on the received code, the iteration, and an indication of whether the update bit slices are for the first or the second plurality of score bit slices. Since in preferred embodiments, the scores return to the initial ordering following k-1 iterations, then it is clear that there are only a finite number of possibilities for the update bit slices. Hence, it is possible to generate a lookup table providing all of the possible update bit slices, thereby removing the need to generate those update bit slices during the decoding process. The size of the lookup table will depend on the number of possible received codes, the number of iterations, and the number of bit slices required to represent an update value. However, for practical examples such as DAB radio, it has been found that the lookup table is of a fairly modest size. For example, considering DAB radio, k=7, and hence the number of iterations is 6. Further, the codes are four bits in length, and accordingly it has been found that the update values can be represented by three bits, and thus only three bit slices are required. This results in 288 (16 codes×6 stages×3 bit slices) update bit slices needing to be stored in the lookup table for each of the first and second plurality of score bit slices used in the update process, or 576 update bit slices in total.

In preferred embodiments, the step (i) comprises the step of subtracting the second candidate plurality of updated score bit slices from the first candidate plurality of updated score bit slices to form a path history bit slice, the bits for a particular score represented by the plurality of updated score bit slices being selected dependent on the value of the bit at a corresponding position in the path history bit slice. In preferred embodiments, the path history bit slice contains the carry out values from the subtraction. Hence, if the first plurality of updated score bit slices is represented by $M_A$, and the second candidate plurality of updated score bit slices is represented by $M_B$, then a zero value at a particular position in the path history bit slice will indicate that the corresponding score in $M_A$ was bigger than the corresponding score in $M_B$, whereas a logic one value will indicate that the corresponding score in $M_B$ was greater than the corresponding score in $M_A$. Hence, based on the values in the path history bit slice, it will be appreciated that it can then be determined which score to use in the final plurality of updated score bit slices generated at step (i).

In preferred embodiments, the path history bit slice is added to a path history consisting of a number of path history bit slices, the path history being employed to determine for any particular state a second predetermined number of bits that are considered to be bits in the original sequence preceding the first predetermined number. In such embodiments, it will be appreciated that there is no need to refer to the previous path history bit slices at this stage, and accordingly the path history bit slice can merely be added to the path history without having to read any of the previous path history bit slices at that point. This is a particularly efficient way of updating the path history.

It will be appreciated that because the individual path histories are not being moved during each iteration, and the states have been allowed to move around (because at least one of the plurality of score bit slices is not re-ordered) then it would appear to be cumbersome to trace back the path history for any particular state. However in preferred embodiments, each path history bit slice is associated with one of said k-1 iterations, whereby with reference to said record the second predetermined number of bits can be determined for any particular state. Hence, it is clear that the necessary information is available to enable the trace back to occur. Further, it has been found that in preferred embodiments if the path history is allowed to become longer than it might otherwise be, then the trace back can be delayed until there are a large number of bits to output, so that the overhead of the trace back becomes lower per output bit. It is important to note that in the preferred embodiments of the present invention, the performance of updating the path history is not effected by the extra length of the path history, as the path history is updated merely by adding a new path history bit slice, without any requirement to read the path history at that stage.

Hence, in preferred embodiments, at predetermined intervals, the scores are compared in order to select the score best meeting predetermined criteria, the state corresponding to that score is determined, and a plurality of said second predetermined number of bits for that state are determined and output as a decoded portion of the original sequence of data bits.

Viewed from a second aspect, the present invention provides a system for decoding an encoded data stream representing an original sequence of data bits, wherein the encoded data stream comprises a plurality of codes, each code being dependent on a current data bit and a first predetermined number of preceding data bits in the original sequence, the system comprising: a score generator for providing, for each of a number of possible states of the first predetermined number of preceding data bits, a score indicating the likelihood that the corresponding state represents the first predetermined number of preceding data bits; a sorter for arranging the scores in an initial ordering; an update value generator, responsive to receipt of a code, for determining for each state, given each of the two possible values of the current data bit in the received code, two update values indicating the likelihood, based on the received code, that that state represents the first predetermined number of bits; the score generator being arranged to collectively represent the initially ordered scores as a first plurality of score bit slices each score bit slice containing a predetermined bit from each of the scores; the sorter being arranged to reorder the scores and the score generator being arranged to collectively represent the reordered scores as a second plurality of score bit slices, each score bit slice containing a predetermined bit from each of the reordered scores; the update value generator being arranged to generate from the update values a first plurality of update bit slices for the first plurality of score bit slices and a second plurality of update bit slices for the second plurality of score bit slices, each update bit slice representing a predetermined bit from predetermined ones of said update values; the score generator being arranged to generate a first candidate plurality of updated score bit slices from the first plurality of score bit slices and the first plurality of update bit slices, to generate a second candidate plurality of updated score bit slices from the second plurality of score bit slices and the second plurality of update bit slices, and to generate a plurality of updated score bit slices by, for each score represented by the bit slices, applying predetermined criteria to select the bits for that score from either the first candidate or the second candidate plurality of updated score bit slices, whereby all the scores are updated simultaneously.

Viewed from a third aspect, the present invention provides a computer program operable to configure a computer processing unit to perform a method as claimed in accordance with the first aspect of the present invention. It will be appreciated that the term "computer processing unit" is intended to cover any computing device that is capable of executing the computer program, and hence, for example, may be a conventional microprocessor, a dedicated logic unit, etc.

Viewed from a fourth aspect, the present invention provides a carrier medium comprising a computer program in accordance with the third aspect of the present invention. The carrier medium may be a storage device, for example a CD-ROM, a diskette, RAM, ROM, etc. Alternatively, the carrier medium may be any other medium via which the computer program is conveyed, for example telecommunications infrastructures facilitating electronic distribution of the computer program over the Internet.

BRIEF DESCRIPTION OF THE DRAWINGS

The present invention will be described further, by way of example only, with reference to a preferred embodiment thereof as illustrated in the accompanying drawings, in which.

DESCRIPTION OF A PREFERRED EMBODIMENT

In contrast to typical prior art approaches where the metrics for each Viterbi state are updated one at a time, the preferred embodiment of the present invention provides a technique whereby all of the metrics are updated simultaneously. As mentioned earlier, this simultaneous update of the metrics for each state is achieved by "bit slicing" the relevant values required in the calculations. However, as is clear from FIG. 2 described earlier, to keep the positions of the states the same, the metrics must move around between updates in a complex fanning-out arrangement. This would imply that when updating the metric for each state, it would be necessary to move all the bits around in each bit slice.

However, in accordance with the preferred embodiments of the present invention, on each update iteration, one set of the metrics is allowed to stay in the same place, and the nominal states which that metric represents then changes from iteration to iteration. This process is illustrated in FIG. 3, which like FIG. 2 illustrates the possible states assuming the constraint length k is 4, and hence where three preceding input bits are used along with a new input bit to generate a transmitted code.

Figure 1:
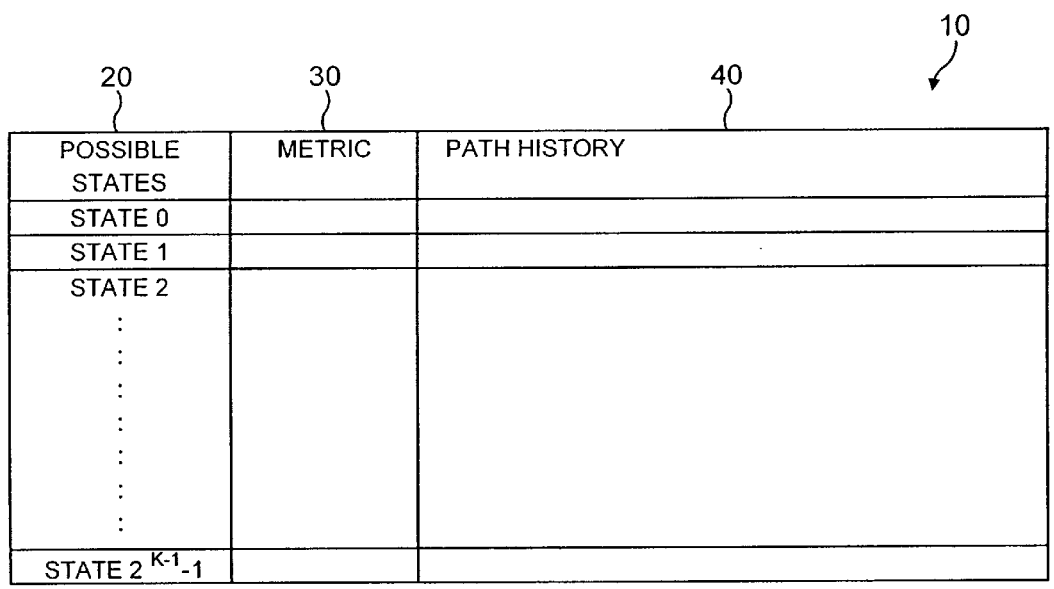
FIG. 1 illustrates a table that may be generated for possible states in accordance with known implementations of Viterbi decoding techniques.
Figure 2:
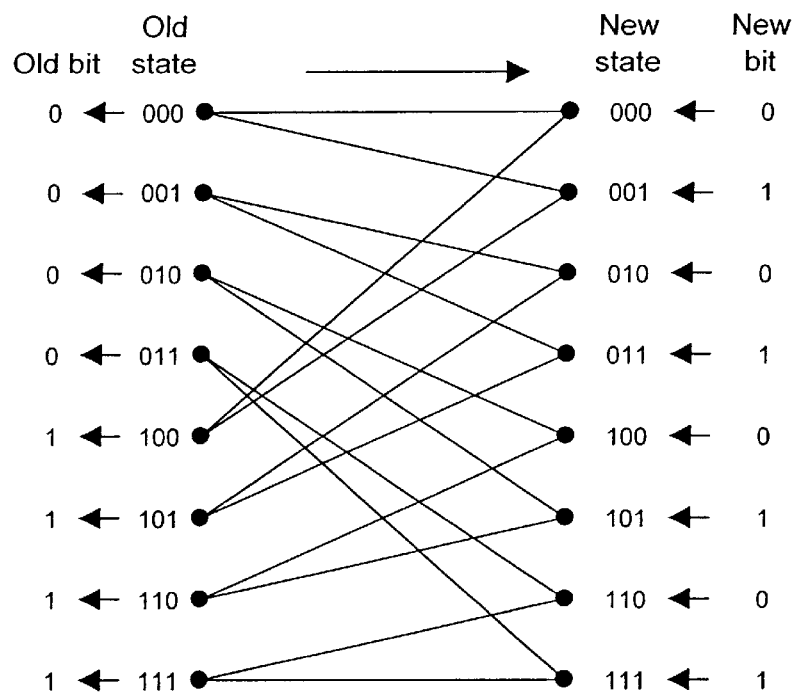
FIG. 2 is a diagram illustrating how the metrics move during an update operation in accordance with known prior art techniques.

As with FIG. 2, it will be seen that all of the eight possible states of the three preceding bits are shown. In each of the update iterations referred to as stage 0, stage 1 and stage 2, one set of metric bit slices stays in the same place, as indicated by the horizontal lines. By necessity, the other set of metric bit slices (to which the first set is to be compared) will have to move, but as is clear from FIG. 3, this movement is in a linear fashion that doesn't involve the fanning-out illustrated in FIG. 2. It has been found that in a typical implementation, this reduces the number of operations required to perform the re-ordering to three per word length bit slice.

Figure 3:
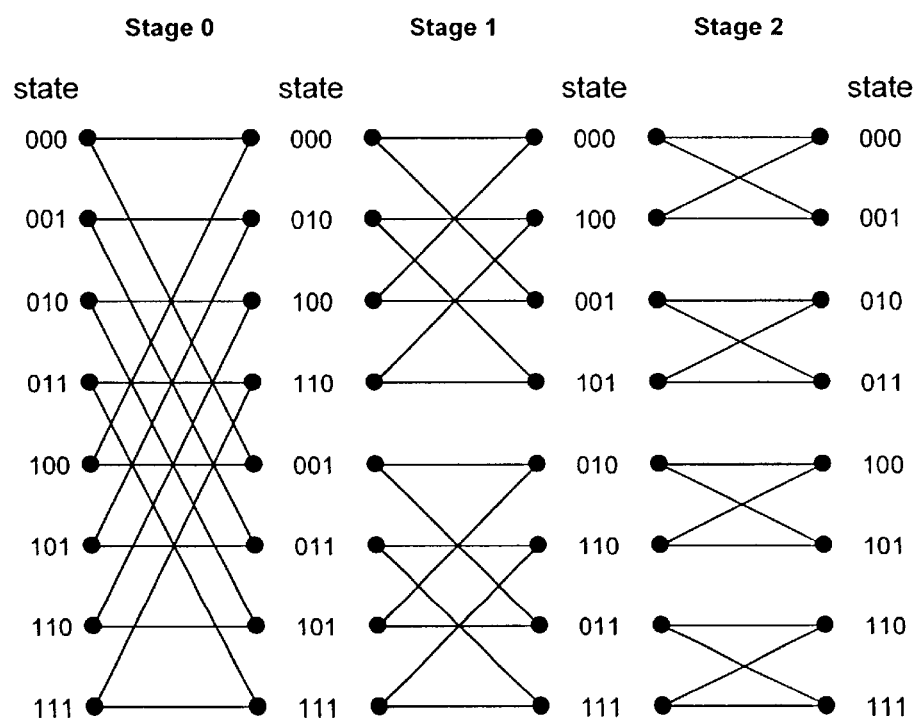
FIG. 3 is a diagram illustrating how metrics and states move during an update operation in accordance with the preferred embodiments of the present invention.

An important point to note from FIG. 3 is that, although after each update stage the nominal state represented by any particular metric in the set of metric bit slices will typically have altered, the states represented by the metric bit slices will return to their original ordering after k-1 stages. Hence, in the example illustrated in FIG. 3, where k=4, the states return to their initial ordering after three stages. Similarly, for DAB radio, where k=7, the states will return to their initial ordering after six stages.

Given that there are only a limited number of different stages, it is clear that it is relatively straightforward to keep track of the state represented by any particular metric within the set of metric bit slices after completion of any particular stage. In particular, for state n, at stage i (i has a value from 0 to k-2), the bits for the metric representing state n will be at bit position (n>>i) in each bit slice (bit position starting at bit position 0), where n>>i represents n rotated i bits to the right with wrap around to bit k-2. This is clear from FIG. 3, where if we consider state 010, at stage 0 the bits of the metric will be at bit position 010, i.e. bit position 2, at stage 1 the bits of the metric will be at bit position 001, i.e. bit position 1, and at stage 2, the bits of the metric will be at bit position 100, i.e. bit position 4. After these three (i.e. k-1) stages, the state 010 returns to its initial ordering (i.e. bit position 2).

As mentioned earlier, when generating updated score bit slices, two different pluralities of score bit slices are used, the bits within the first plurality of score bit slices (referred to hereafter as M) remaining in their original ordering, and the bits within the second plurality of score bit slices (referred to hereafter as $M_x$) moving in the linear fashion illustrated in FIG. 3. In preferred embodiments. $M_x$ is calculated as described below, where k is the constraint length and i (0 . . . k-2) is the number of the stage.

Set:
s=(k-2)-i;
shift=2^(s);
mask=a mask of 2^(k-1) bits with: bit j of the mask set if bit s is set of j (in other words the mask is a repeating pattern of 'shift' zeros followed by 'shift' ones).

Then $M_x$=((M<<shift) AND mask) OR ((M>>shift) AND NOT mask)

In preferred embodiments, in addition to arranging the metrics in bit slice format, the Hamming distances are also arranged as bit slices. Given that there will typically only be a limited number of stages before the states return to their initial ordering, then there will only be a limited number of Hamming distance bit slices that are possible. Accordingly, in preferred embodiments, these bit slices are predetermined, and stored in a lookup table for use during the decoding process. The following equation illustrates how any particular Hamming distance bit slice is obtained from the lookup table:

Hamming distance<bit slice>=lookuptable [received code] [stage] [bit slice] [M or $M_x$].

As mentioned earlier, for DAB radio, k=7, and hence the number of stages is 6. and further the codes are 4 bits in length. In addition, the Hamming distances can be represented by 3 bits, and accordingly there are 3 bit slices to be obtained from the lookup table for any particular set of Hamming distances needed for an update operation. Based on the above equation, there are 576 possibilities of Hamming distance bit slice, and hence these can readily be stored in a lookup table.

Given that in accordance with the preferred embodiments of the present invention, the states are not static, but rather move between stages, it might appear that this would significantly increase the complexity of the traceback process required to read out bits from the path history. However, in preferred embodiments, the path history is also stored as bit slices, and this significantly reduces the path history update overhead, as the path history does not need to be loaded in order to update it. Instead, the new path history bit slice is merely written to the end of the history buffer. However, because the path histories are not being moved to follow the movement of the states between stages, then there is some additional complexity involved in performing traceback. However, in preferred embodiments, this is alleviated somewhat by providing a slightly larger history buffer, delaying the traceback, and then producing multiple output bits as a result of a single traceback process. If the path history is allowed to become longer, then it is possible to delay the traceback until there is a large number of bits to output, so that the overhead of the trace back becomes lower per output bit. The performance of updating the path is not affected by the extra length of the path history, since in preferred embodiments the path history is handled as a sequence of bit slices, and each path history bit slice is merely added to the end of the history buffer without the need to load in the path histories at that stage.

Figure 4:
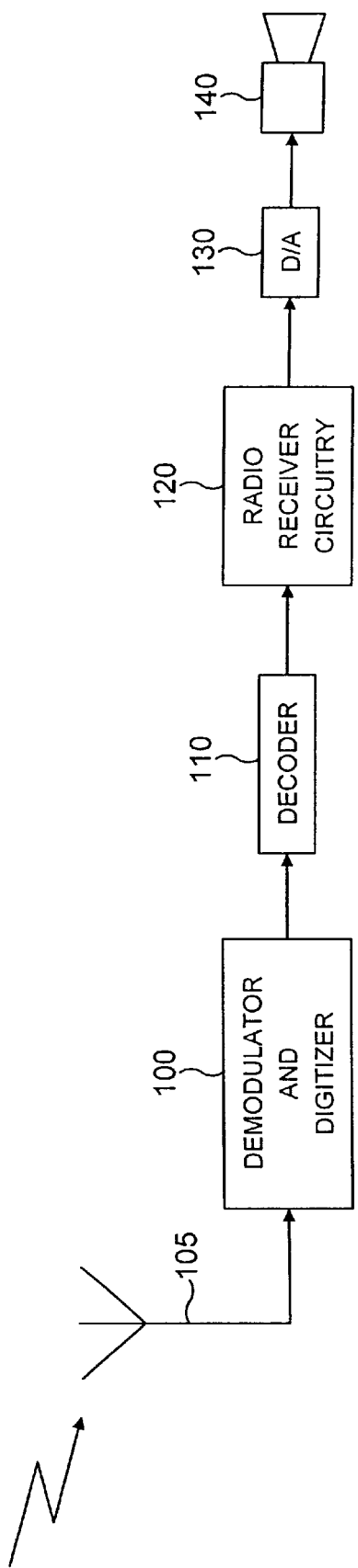
FIG. 4 is a block diagram illustrating the basic components of a DAB receiver to which the technique of preferred embodiments of the present invention may be applied.

Having provided a general discussion of the technique of the preferred embodiment, a discussion of its implementation within a DAB radio receiver will now be discussed in more detail with reference to FIGS. 4 and 5. FIG. 4 is a block diagram providing an illustration of the basic functional blocks provided within a DAB receiver. A convolutionally encoded radio signal is received at an antenna 105, and passed through demodulator and digitizer circuitry 100 in order to demodulate the signal, and provide analogue to digital conversion. It will be appreciated by those skilled in the art that this circuitry is well-known, and accordingly will not be discussed further herein. A digitised signal is then passed to a decoder 110, where the decoding process of preferred embodiments of the present invention takes place, resulting in a sequence of data bits being output to radio receiver circuitry 120. As will be appreciated by those skilled in the art, the radio receiver circuitry 120 can be provided by any one of a number of well-known receiver circuits, and accordingly will not be discussed any further herein. The output of the radio receiver circuitry 120 is then converted back to an analogue signal by digital to analogue converter 130, before being output to a speaker 140.

Figure 5:
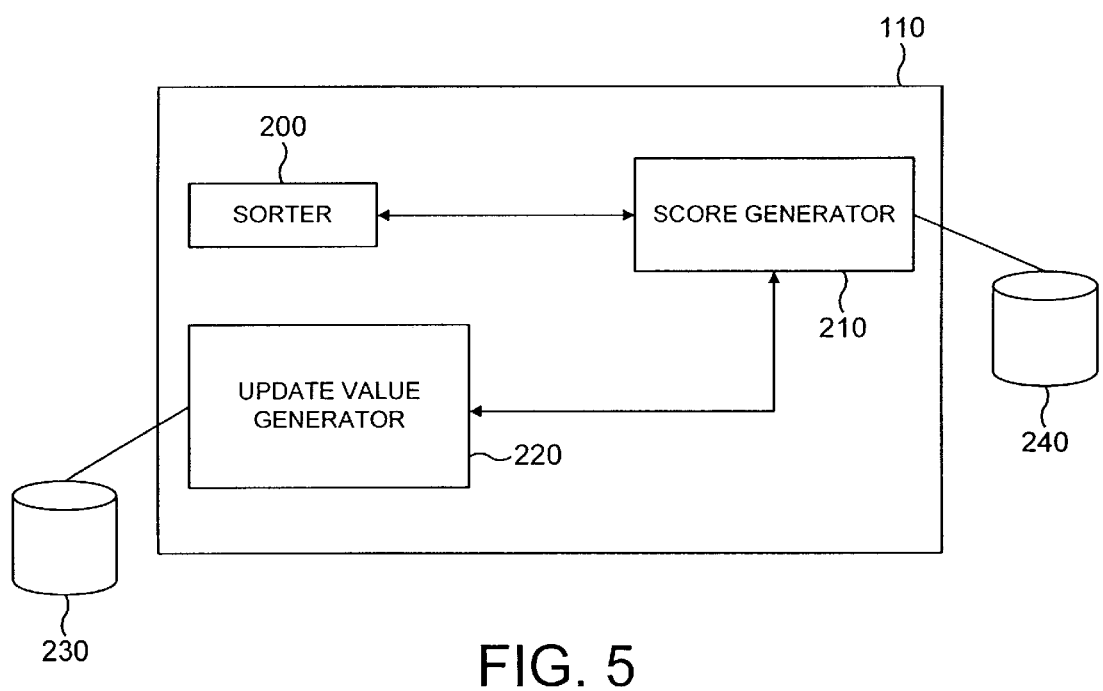
FIG. 5 is a block diagram schematically illustrating the functional components within the decoder of FIG. 4 in accordance with preferred embodiments of the present invention.

FIG. 5 is a block diagram conceptually illustrating the main functional elements within the decoder 110 in accordance with the preferred embodiments of the present invention. The storage 240 represents general storage accessible to the decoder 110, for storing data required by the score generator 210, and may take the form of cache, RAM, DRAM, etc, or a combination of such storage devices. Hence, the current score bit slices, the path history bit slices, and an indication of the current iteration stage (and hence of the current ordering of the states) may be stored in the storage 240. The score generator 210 is arranged to collectively represent the scores (or metrics) as a first plurality of score bit slices. Further, the sorter 200 is arranged to be responsive to information provided by the score generator concerning the iteration stage, to re-order the scores, and to feedback the re-ordered scores to the score generator to enable a second plurality of score bit slices to be provided for use during the update process.

The update value generator 220 is responsive to the score generator 210 to access a lookup table 230 in order to retrieve Hamming distance bit slices for use by the score generator 210. The score generator will indicate to the update value generator 220 the iteration stage, and whether the bit slices are required for the first plurality of score bit slices or the second plurality of score bit slices. Based on this information, and an indication of the received code being decoded, the update value generator 220 will access the lookup table 230 to obtain Hamming distance bit slices, which are then returned to the score generator 210. It will be appreciated by those skilled in the art that the lookup table 230 may physically reside within the storage 240, or alternatively may be provided separately.

The score generator 210 is then responsible for generating the plurality of updated score bit slices and for outputting a path history bit slice to the storage 240 to update the path history. The score generator 210 may also perform a traceback routine as required in order to output a number of bits from the decoder. This traceback process begins by determining the best metric (e.g. the one having the smallest value) and starting from the corresponding value in the most recent path history bit slice, and an indication of the iteration stage, the score generator 210 can trace back through the various path history bit slices based on a knowledge of the inter-relationship between the states from one iteration stage to another (as indicated schematically in FIG. 3), this inter-relationship typically being stored within a lookup table accessible to the score generator 210. This traceback process results in the identification of one or more output bits for outputting from the decoder.

In preferred embodiments of the present invention, the functions of the sorter 200, score generator 210 and update value generator 220 are implemented in software executable on a microprocessor, although it will be appreciated that one or more of these functions could alternatively be embodied in firmware or hardware.

The process performed by the decoder 110 in order to process each received code and update the metrics accordingly will now be described in more detail with reference to the flow diagrams of FIGS. 6 and 7. The process starts at step 300, where two parameters "Stage" and "Count" are set equal to zero. Then, at step 310, it is determined whether a new code has been received. Once a new code is received, the process proceeds to step 320, where the metrics are updated. This process will be described in more detail later with reference to FIG. 7.

Once the metrics have been updated, the parameter Stage is incremented by one at step 330, and then at step 340 it is determined whether the parameter Stage is greater than or equal to six (i.e. k-1). If it is, then the process branches to step 350, where the metrics are renormalised, after which the parameter Stage is reset to zero at step 360. It will be appreciated by those skilled in the art that there are a number of techniques that may be used for renormalising metrics, this process being used to ensure that the value of any particular metric does not exceed the number of bits allocated for the storage of each metric. Clearly, the value chosen for the comparison at step 340, which causes the renormalisation to take place, will be chosen dependent on the implementation, and hence in certain implementations, it may be appropriate to choose a value other than six.

If at step 340, it is determined that the parameter state is not greater than or equal to six, the process proceeds to step 370. The process also proceeds to step 370 from step 360, if the renormalisation process was invoked from step 340.

At step 370, the parameter Count is incremented by one, and then at step 380 it is determined whether Count is greater than or equal to sixty. If it isn't, then the process returns to step 310 to await receipt of the next code. However, if Count is greater than or equal to sixty, then the process proceeds to step 390, where a predetermined number of bits are output by the decoder using the earlier described traceback process. Once the predetermined number of bits have been output, the parameter Count is reset to zero at step 395, and the process then returns to step 310.

Figure 6:
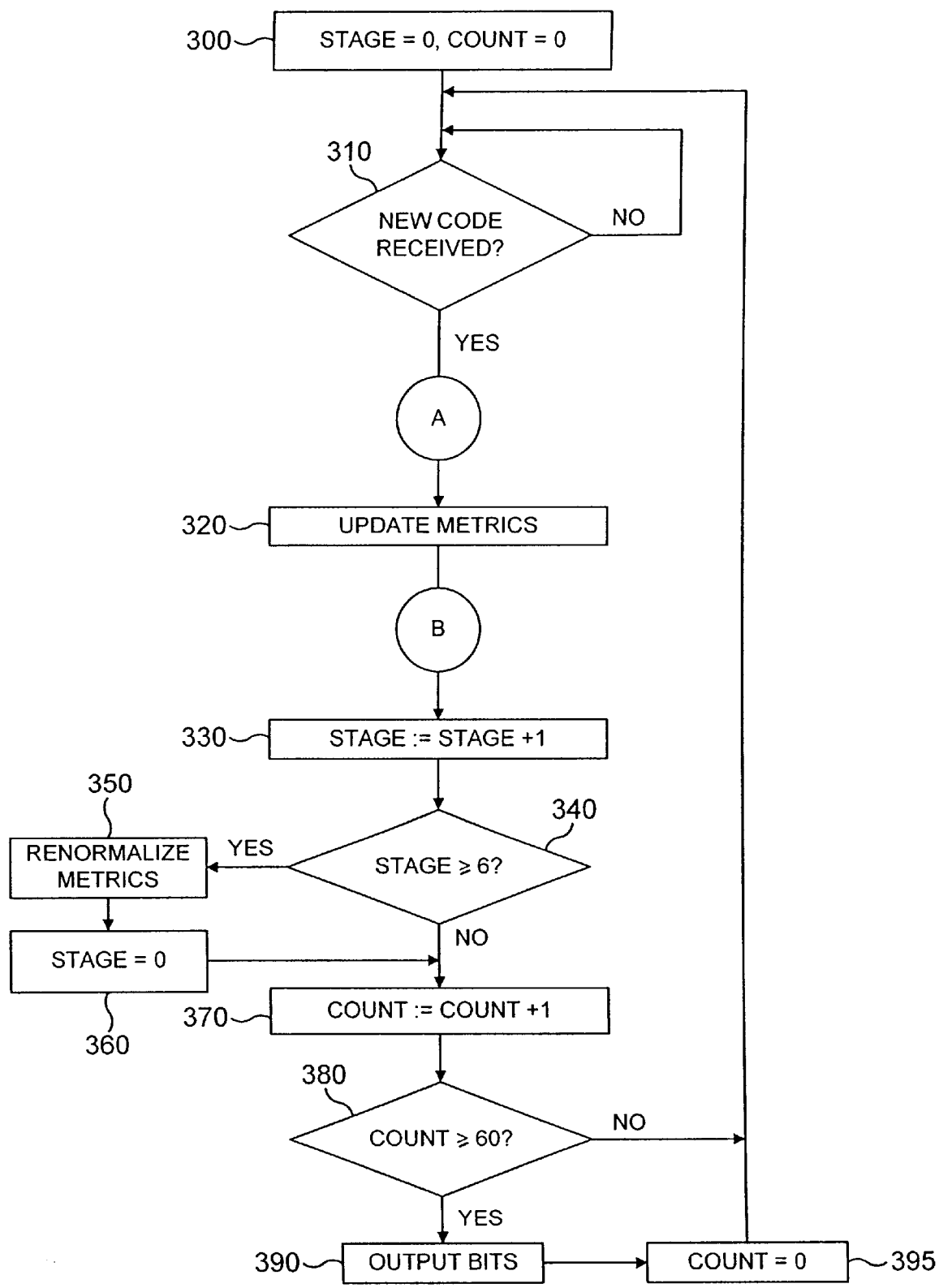
FIGS. 6 and 7 are flow diagrams illustrating the process performed within the decoder of FIG. 4 in accordance with preferred embodiments of the present invention.
Figure 7:
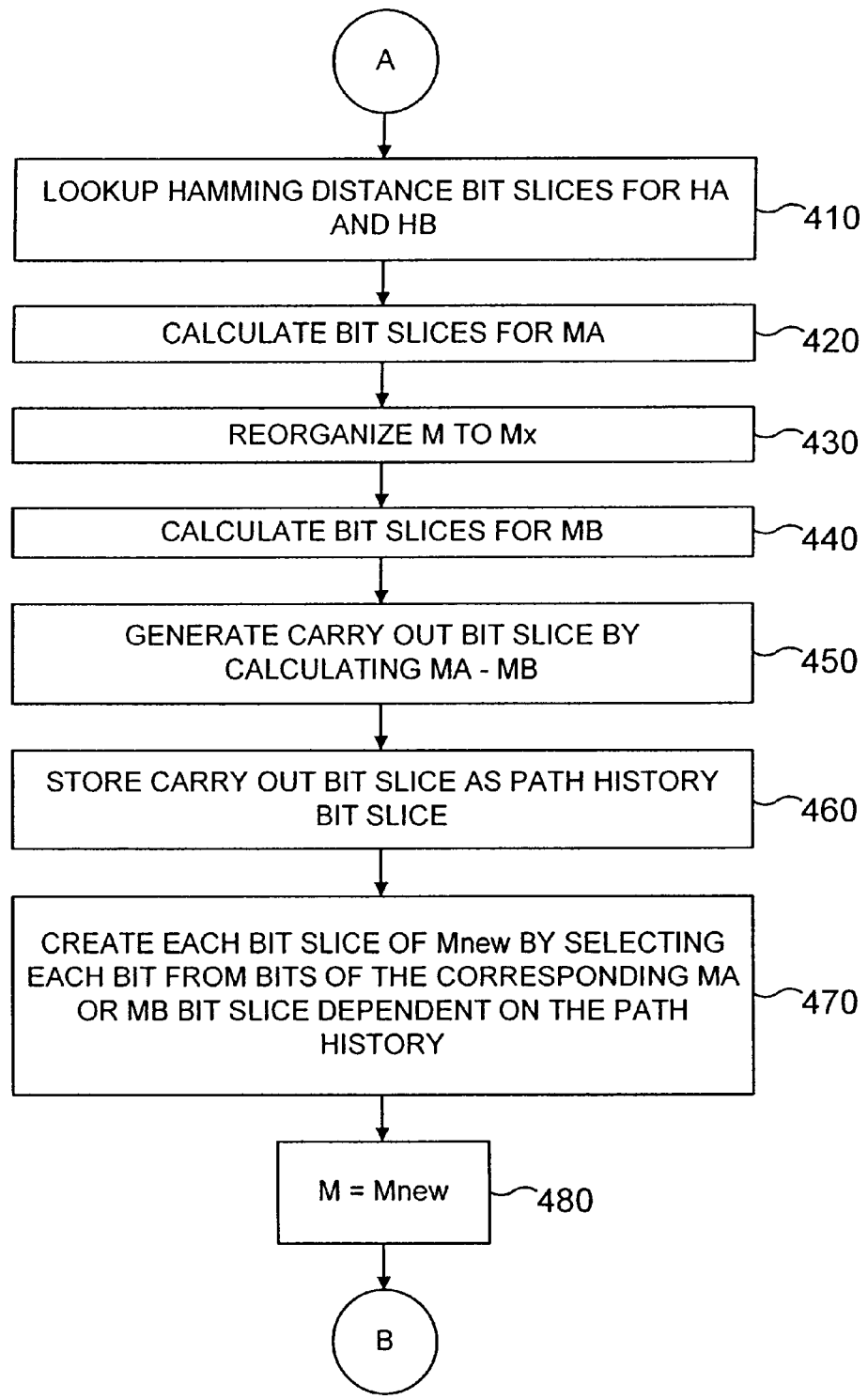

FIG. 7 describes in more detail the process performed within the decoder to update the metrics at step 320 of FIG. 6.

Starting at step 410, the Hamming distance bit slices for a first plurality of Hamming distance bit slices HA and a second plurality of Hamming distance bit slices HB are determined. As mentioned earlier, this process is performed by the update value generator function 220. Then, at step 420, a first candidate plurality of updated score bit slices MA is calculated. This calculation involves adding the first plurality of Hamming distance bit slices HA to the first plurality of score bit slices M (i.e. the plurality of bit slices that have not been re-ordered). This is achieved by adding the individual bit slices for a particular bit position together, and taking any carry bits on to the addition performed in respect of the bit slices for the next bit position.

At step 430, the first plurality of score bit slices M is re-ordered to produce a second plurality of score bit slices $M_x$. Then, at step 440, a second candidate plurality of updated score bit slices MB is calculated by adding $M_x$ to HB.

At step 450, MB is subtracted from MA in order to generate a carry out bit slice. Accordingly, a zero value at a particular position in the carry out bit slice will indicate that the corresponding score in MA was bigger than the corresponding score in MB, whereas a logic one value will indicate that the corresponding score in MB was greater than the corresponding score in MA.

This carry out bit slice is used as the path history bit slice for this particular update operation, and accordingly the carry out bit slice is stored as the path history bit slice at step 460, resulting in an updated path history. Further, at step 470, a plurality of updated score bit slices $M_{new}$ is generated by selecting each bit within each bit slice from corresponding bits of MA or MB dependent on the path history bit slice. Hence, as an example, if it is assumed that a lower value of metric will indicate a closer match, then the zero value at a particular position in the path history bit slice will indicate that the corresponding score from MB should be used, whilst a logic one value will indicate that the corresponding score from MA should be used in $M_{new}$. Once $M_{new}$ has been created at step 470, then the process proceeds to step 480, where $M_{new}$ is set equal to the new basic metric M for use in a subsequent update process. The process then proceeds to point B illustrated in FIG. 6.

From the above description, it will be appreciated that the technique of the preferred embodiment of the present invention provides a particularly efficient way for enabling the metrics for all of the Viterbi states to be updated simultaneously. As mentioned earlier, this technique is preferably embodied in software, which may be executed on a processor core. The technique of preferred embodiments of the present invention makes it possible to produce the required high output rate of bits from the decoder using current high end processor cores.

Although a particular embodiment of the invention has been described herewith, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of decoding an encoded data stream representing an original sequence of data bits, wherein the encoded data stream comprises a plurality of codes, each code being dependent on a current data bit and a first predetermined number of preceding data bits in the original sequence, the method comprising the steps of:
   (a) for each of a number of possible states of the first predetermined number of preceding data bits, providing a score indicating the likelihood that the corresponding state represents the first predetermined number of preceding data bits;
   (b) arranging the scores in an initial ordering;
   (c) receiving a code;
   (d) given each of the two possible values of the current data bit in the received code, determining for each state two update values indicating the likelihood, based on the received code, that that state represents the first predetermined number of bits;
   (e) storing a first plurality of score bit slices to collectively represent the scores as arranged at said step (b), each score bit slice containing a predetermined bit from each of the scores;
   (f) reordering the scores and storing a second plurality of score bit slices to collectively represent the reordered scores, each score bit slice containing a predetermined bit from each of the reordered scores;
   (g) generating from the update values a first plurality of update bit slices for the first plurality of score bit slices and a second plurality of update bit slices for the second plurality of score bit slices, each update bit slice representing a predetermined bit from predetermined ones of said update values;
   (h) generating a first candidate plurality of updated score bit slices from the first plurality of score bit slices and the first plurality of update bit slices, and generating a second candidate plurality of updated score bit slices from the second plurality of score bit slices and the second plurality of update bit slices;
   (i) generating a plurality of updated score bit slices by, for each score represented by the bit slices, applying predetermined criteria to select the bits for that score from either the first candidate or the second candidate plurality of updated score bit slices;

whereby all the scores are updated simultaneously.

2. A method as claimed in claim 1, wherein upon receipt of a further code from the encoded data stream, the plurality of updated score bit slices are treated as the first plurality of score bit slices and steps (f) to (i) are repeated, with the update values used in step (g) being based on the further code.

3. A method as claimed in claim 2, wherein each code is dependent on k bits, and although during each iteration of steps (f) to (i) the states represented by individual scores contained within the plurality of updated score bit slices change, the scores return to the initial ordering following k-1 iterations of the steps (f) to (i).

4. A method as claimed in claim 3, wherein a record is maintained of the states represented by the individual scores for each of the k-1 iterations.

5. A method claimed in claim 3, wherein the reordering of the scores at the step (f) is dependent on the particular iteration.

6. A method as claimed in claim 3, wherein step (d) is executed prior to decoding the encoded data stream in order to generate a lookup table of update bit slices for each of the k-1 iterations, whereby at said step (g) the update bit slices are read from the lookup table based on the received code, the iteration, and an indication of whether the update bit slices are for the first or the second plurality of score bit slices.

7. A method as claimed in claim 1, wherein the step (i) comprises the step of subtracting the second candidate plurality of updated score bit slices from the first candidate plurality of updated score bit slices to form a path history bit slice, the bits for a particular score represented by the plurality of updated score bit slices being selected dependent on the value of the bit at a corresponding position in the path history bit slice.

8. A method as claimed in claim 7, wherein the path history bit slice is added to a path history consisting of a number of path history bit slices the path history being employed to determine for any particular state a second predetermined number of bits that are considered to be bits in the original sequence preceding the first predetermined number.

9. A method as claimed in claim 8, wherein a record is maintained of the states represented by the individual scores for each of the k-1 iterations, and wherein each path history bit slice is associated with one of said k-1 iterations, whereby with reference to said record the second predetermined number of bits can be determined for any particular state.

10. A method as claimed in claim 8, where at predetermined intervals, the scores are compared in order to select the score best meeting predetermined criteria, the state corresponding to that score is determined, and a plurality of said second predetermined number of bits for that state are determined and output as a decoded portion of the original sequence of data bits.

11. A system for decoding an encoded data stream representing an original sequence of data bits, wherein the encoded data stream comprises a plurality of codes, each code being dependent on a current data bit and a first predetermined number of preceding data bits in the original sequence, the system comprising:

a score generator for providing, for each of a number of possible states of the first predetermined number of preceding data bits, a score indicating the likelihood that the corresponding state represents the first predetermined number of preceding data bits;

a sorter for arranging the scores in an initial ordering;

an update value generator, responsive to receipt of a code, for determining for each state, given each of the two possible values of the current data bit in the received code, two update values indicating the likelihood, based on the received code, that that state represents the first predetermined number of bits;

the score generator being arranged to collectively represent the initially ordered scores as a first plurality of score bit slices, each score bit slice containing a predetermined bit from each of the scores;

the sorter being arranged to reorder the scores and the score generator being arranged to collectively represent the reordered scores as a second plurality of score bit slices, each score bit slice containing a predetermined bit from each of the reordered scores;

the update value generator being arranged to generate from the update values a first plurality of update bit slices for the first plurality of score bit slices and a second plurality of update bit slices for the second plurality of score bit slices, each update bit slice representing a predetermined bit from predetermined ones of said update values;

the score generator being arranged to generate a first candidate plurality of updated score bit slices from the first plurality of score bit slices and the first plurality of update bit slices, to generate a second candidate plurality of updated score bit slices from the second plurality of score bit slices and the second plurality of update bit slices, and to generate a plurality of updated score bit slices by, for each score represented by the bit slices, applying predetermined criteria to select the bits for that score from either the first candidate or the second candidate plurality of updated score bit slices, whereby all the scores are updated simultaneously.

12. A computer program operable to configure a computer processing unit to perform a method as claimed in claim 1.

13. A carrier medium comprising a computer program as claimed in claim 12.

* * * * *